United States Patent [19]

Schoenborn

[11] Patent Number: 5,362,356

[45] Date of Patent: Nov. 8, 1994

[54] PLASMA ETCHING PROCESS CONTROL

[75] Inventor: Philippe Schoenborn, San Jose, Calif.

[73] Assignee: LSI Logic Corporation, Milpitas, Calif.

[21] Appl. No.: 821,727

[22] Filed: Jan. 14, 1992

Related U.S. Application Data

[63] Continuation-in-part of Ser. No. 632,461, Dec. 20, 1990.

[51] Int. Cl.⁵ .............................................. H01L 21/00
[52] U.S. Cl. .................................. 156/626; 156/643; 156/651; 156/657
[58] Field of Search ............... 156/626, 627, 651, 643, 156/646, 657, 653, 656; 204/192.33

[56] References Cited

U.S. PATENT DOCUMENTS

| | | | |
|---|---|---|---|
| 4,312,732 | 1/1982 | Degenkoig et al. | |
| 4,357,195 | 11/1982 | Gorin | 156/626 X |
| 4,415,402 | 11/1983 | Gelerat et al. | 156/626 |
| 4,444,618 | 4/1984 | Saia et al. | 156/626 X |
| 4,454,001 | 6/1984 | Steraheim et al. | 156/626 |
| 4,457,820 | 7/1984 | Bergeron et al. | 156/643 X |
| 4,493,745 | 1/1985 | Chen et al. | 156/626 |
| 4,680,084 | 7/1987 | Heimann et al. | 156/626 |
| 4,687,539 | 8/1987 | Burns et al. | 156/626 |
| 4,717,446 | 1/1988 | Nagy et al. | 156/626 |
| 4,846,928 | 7/1989 | Dolins et al. | 156/626 |
| 4,847,792 | 7/1989 | Barna et al. | 364/552 |
| 4,861,419 | 8/1989 | Flinchbaugh et al. | 156/626 |
| 4,936,967 | 6/1990 | Ikuhara et al. | 204/192.33 |
| 5,023,188 | 7/1991 | Tanaka | 437/8 |
| 5,139,904 | 8/1992 | Anda et al. | 156/643 X |

OTHER PUBLICATIONS

"Monte-Carlo Simulation of Plasma Etch Emission Endpoint", E. J. Bawolek, Emerging Semiconductor Technology, ASTM STP 960; D. C. Gupta and P. H. Langer, Eds., American Society for testing and Materials, 1986.

"Optical Emission Spectroscopy of Reactive Plasmas: A Method for Correlating Emission Intensities to Reactive Particle Density", J. W. Coburn, M. Chen, J. Appl. Phys., 51, pp. 3134–3136, Jun. 1980.

Primary Examiner—Thi Dang
Attorney, Agent, or Firm—Gerald E. Linden

[57] ABSTRACT

A passive, in-line method of monitoring film removal (or deposition) during plasma etching (or deposition) based on interference phenomena is disclosed. Plasma emission intensity is monitored at a selected wavelength, without additional illuminating apparatus, and variations in plasma emission intensity are correlated to remaining film thickness, etch rate and uniformity, and etch selectivity. The method is useful in conjunction with nitride island etch, polysilicon etch, oxide spacer etch, contact etch, etc. The method is also useful in determining a particular remaining film thickness (e.g., just prior to clearing) at which point the etch recipe can be changed from a high-rate, low selectivity etch to a low-rate, high-selectivity etch.

12 Claims, 7 Drawing Sheets

PLASMA ETCHING PROCESS CONTROL

CROSS-REFERENCE TO RELATED APPLICATIONS

This is a continuation-in-part of copending, commonly-owned U.S. patent application No. 632,461, filed on Dec. 20, 1990.

TECHNICAL FIELD OF THE INVENTION

The invention relates to semiconductor device fabrication, and more particularly to plasma etching. Utility of the invention in plasma deposition is also disclosed.

BACKGROUND OF THE INVENTION

An important process in the fabrication of integrated circuits is the removal of various layers of materials formed on a silicon wafer. Two major etching techniques are in common usage; 1) wet, or chemical etching, wherein a photoresist-patterned silicon wafer is immersed in a chemical solution; and 2) dry, or plasma etching, wherein a wafer is exposed to a plasma containing a gas such as $CF_4$. The present invention relates mainly to plasma etching.

Plasma etch processes and apparatus are generally well known for etching materials for semiconductor device fabrication. The process begins with application of a masking material, such as photoresist, to a silicon wafer. The masking pattern protects areas of the wafer from the etch process. The wafer is then placed in a plasma reactor ("etcher") and etched. Subsequent steps are determined by the type of device being fabricated. This process is especially valuable for the definition of small geometries.

A common etch process involves the removal of polysilicon ("poly") overlying gate oxide ("oxide"). Among other issues involved, the selectivity of etch between the poly and the underlying gate oxide ("poly:oxide selectivity") should be as high as possible so as to reduce oxide loss.

Using a typical etcher, such as the top-powered, wafer-grounded LAM 490 etcher, poly:oxide selectivities in excess of 100:1 can be achieved with low power (100 Watt) $Cl_2$/He plasmas, but can result in severe undercutting or notching of the poly sidewall. On the other hand, helium-rich (greater than 50%), high power (greater than 200 Watts) processes produce vertical sidewalls at the expense of selectivity (less than 30%) and tend to incidentally damage the gate oxide. Lateral etching occurs during the overetch cycle and not during bulk poly removal. Hence, the amount of overetch must be limited.

Irrespective of the particular etch process being employed, it is generally of universal concern to detect when an overlying material ("film") has been completely removed ("cleared"). This is generally accomplished by detecting the presence of the underlying material, now exposed, in the plasma, such as by spectroscopy.

It would also be advantageous to know (i.e., be able to detect) when a desired amount of material, in some cases less than all of the overlying material, has been removed.

U.S. Pat. No. 4,415,402 discloses a method for determining the completion of removal ("clearing") by plasma etching of phosphorous doped silicon dioxide from an underlying substrate. The patent illustrates an endpoint detection technique wherein a specific wavelength, or range of wavelengths, changes in intensity upon clearing the etched material. The patent does not describe a technique for detecting when the film being etched reaches a known, pre-cleared thickness.

U.S. Pat. No. 4,454,001 discloses an interferometric method for measuring etch rate. The method makes use of the phenomenon that device patterns etched into substrates produce diffraction patterns when illuminated. A beam of light is directed onto a region of a substrate being etched. The light reflected from the region forms a diffraction pattern, and the intensity of a diffraction order is detected and recorded as a function of time during the etching process. The etch rate of the substrate is inversely proportional to the period of oscillations in the recorded intensity/time curve.

U.S. Pat. No. 4,680,084 discloses interferometric methods for etch monitoring and thickness measurement. The etch depth of a substrate region undergoing etching is monitored, or the thickness of the region is measured, by impinging the region with light and detecting the intensity of the reflected light.

U.S. Pat. No. 4,687,539 discloses endpoint detection and control of a laser etching process. An excimer laser vaporizes successive layers of a chromium on a region, and a chromium chloride reaction product is formed on the region being etched. A dye laser directed to a zone above the region being etched causes copper chloride in the zone to fluoresce. A narrow band photodetector registers the fluorescence.

U.S. Pat. No. 4,717,446 discloses endpoint detection for etching epitaxially grown silicon. A "monitor" wafer is etched along with "working" wafers. The monitor wafer consists of a silicon substrate having an oxide layer and a polysilicon layer deposited thereon. A laser is used to measure the etch rate of the monitor wafer by measuring reflected light off of the oxide layer.

U.S. Pat. No. 4,936,937 discloses a method of detecting an endpoint of plasma treatment. The use of a spectroscope is disclosed.

U.S. Pat. No. 5,023,188 discloses an interferometric method whereby etched trench depth is determined by shining coherent light onto a wafer surface.

U.S. Pat. Nos. 4,846,928, 4,847,792 and 4,861,419 generally disclose methods of comparing endpoint traces obtained by conventional means with a reference trace in order to detect abnormalities. Reference is made to determining regions of an endpoint curve (i.e., before endpoint, during endpoint, overetch), and taking the slope of the curvature within such regions.

In the references noted above, we generally see that: 1) various techniques and equipment are known for monitoring plasma etching processes; 2) the use of separate illuminating light (e.g., laser) is employed for monitoring; 3) often, test (monitor) wafers are required to characterize and/or monitor etching; and 4) endpoint detection is primarily detected at monitoring clearing of a film (layer) being etched.

Regarding the etching process itself, various etch "recipes" may be used. For example, the flow rate and pressure, electrode spacing, and gaseous species may be varied depending on the material being etched to yield desired selectivities, etch rate and uniformity.

DISCLOSURE OF THE INVENTION

It is therefore an object of the present invention to provide technique for real-time thickness measurement using standard endpoint detection devices.

It is a further object of the present invention to provide a technique for observing interference effects in plasma etching using passive monitoring devices, without using active illumination sources (e.g., separate laser).

It is another object of the present invention to provide a technique for switching over from a relatively high rate, low selectivity etch process to a more selective etch process at a stage in the etching process where the film being etched is at a known remaining thickness.

It is a further object of the present invention to provide a technique for determining etch rate uniformity, average etch rate, and selectivity, on working wafers (i.e., without using a monitor wafer).

It is a further object of the present invention to provide a technique for characterizing etch parameters that is self-calibrating.

It is a further object of the present invention to provide a technique for in-line qualification of etching equipment, without the need for test (monitor) wafers or off-line thickness measurements.

According to the invention, plasma emission intensity is monitored during etching, at a particular wavelength, and is correlated to remaining thickness of a film being etched. In this manner, it can be determined when one or more known film thicknesses remain over a substrate.

According to a feature of the invention, by knowing when certain remaining film thicknesses occur, the overall etching process can be calibrated on-the-fly. In this manner, by knowing etch rate and remaining thickness, etch endpoint can be closely predicted, and overetch can be more carefully controlled.

According to another feature of the invention, etching of a layer can proceed initially with a high-rate, low-selectivity etch recipe, and when it is determined that a known film thickness remains, the etching recipe can be changed to one having a lower rate, but higher selectivity, to more carefully control overetch, undercutting and possible damage to the underlying substrate.

By using the plasma itself as a light source and as a media to convey thickness information, the use of additional active illumination sources is avoided. This can be very useful when etching must be stopped before clearing the underlying material. The disclosed techniques can also be useful in monitoring plasma deposition processes (i.e., rather than in monitoring etching).

Further according to the invention, an in-line qualification process for determining etch rate, uniformity and selectivity is facilitated by monitoring plasma emission intensity.

Other objects, features and advantages of the invention will become apparent in light of the following description thereof.

The following nomenclature (abbreviations) is used in the description that follows:

I plasma emission intensity
S monitored signal
t time
[X*] a species X concentration in its excited state
[X] a species X concentration in its ground state
A total exposed area, not including any etch mask
a cleared area, area being overetched
E wafer-averaged etch rate of film being etched
E' wafer-averaged etch rate of underlying material
$\Sigma_y$ summation over indices y
$k_y$ second order reaction rate with species Y
[Y] a species Y concentration
$k_e$ electron impact dissociation rate
$k_p$ pumping rate
c,b,k,$\beta$,$\alpha$,B constants
$S_o$ intensity of monitored signal before endpoint
$S_\infty$ intensity of monitored signal after complete clearing
$t_1$ time when the wafer starts clearing
$t_2$ time when the wafer completed its etch
H initial average film thickness
$U_n$ initial film uniformity
u uniformity of etch rate E
$E_O$ etch rate at the wafer center
$E_R$ etch rate at the wafer edge
r radial position
R wafer radius
$\Delta t$ infinitesimal time increment
$\Delta r$ infinitesimal radial increment
$\delta$ a variable
T time to endpoint
$T_E$ total etch time including overetch
$d_0$ initial underlying film thickness
$d_m$ minimum underlying film thickness after etch
$d_a$ average underlying film thickness after etch
$R_m$ minimum selectivity between etch rates E and E'
R average selectivity between etch rates E and E'
$i_0,i_e,S_e,S_O$ fitting parameters

DETAILED DESCRIPTION OF THE INVENTION

Inasmuch as the invention relates to monitoring plasma etching, and the apparatus used is well known, the description that follows is directed to techniques, rather than to any particular apparatus.

Optical Interference in Plasma Etching Endpoint Monitoring

In reflectivity spectrophotometry (interferometry), the thickness of a film or stack of films can be determined by measuring the reflectivity of the film compared to that of the reference substrate. The substrate is usually totally reflective, such as silicon or aluminum. Multiple reflections of incident light at the interfaces combine to produce a reflectance that depends on the film thickness. The interference pattern changes with wavelength also. Various film thickness measuring tools use this effect.

Figure 1:
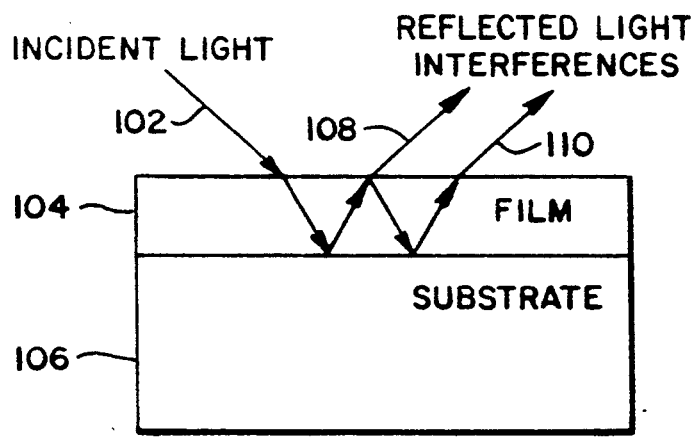
FIG. 1 is a schematic representation of interference from multiple reflections within a thin transparent film on reflective substrate, and is representative of the prior art.

FIG. 1 shows the mechanism of interference resulting from multiple reflections within a thin transparent film on reflective substrate. Incident light 102 is refracted through a thin film 104 and is reflected from the top surface of an underlying substrate 106. A ray 108 is indicative of light exiting the film after one reflection by the substrate. A portion of this light is internally reflected from the top surface of the film back onto the substrate. A ray 110 is indicative of light exiting the film after two reflections by the substrate.

Figure 2:
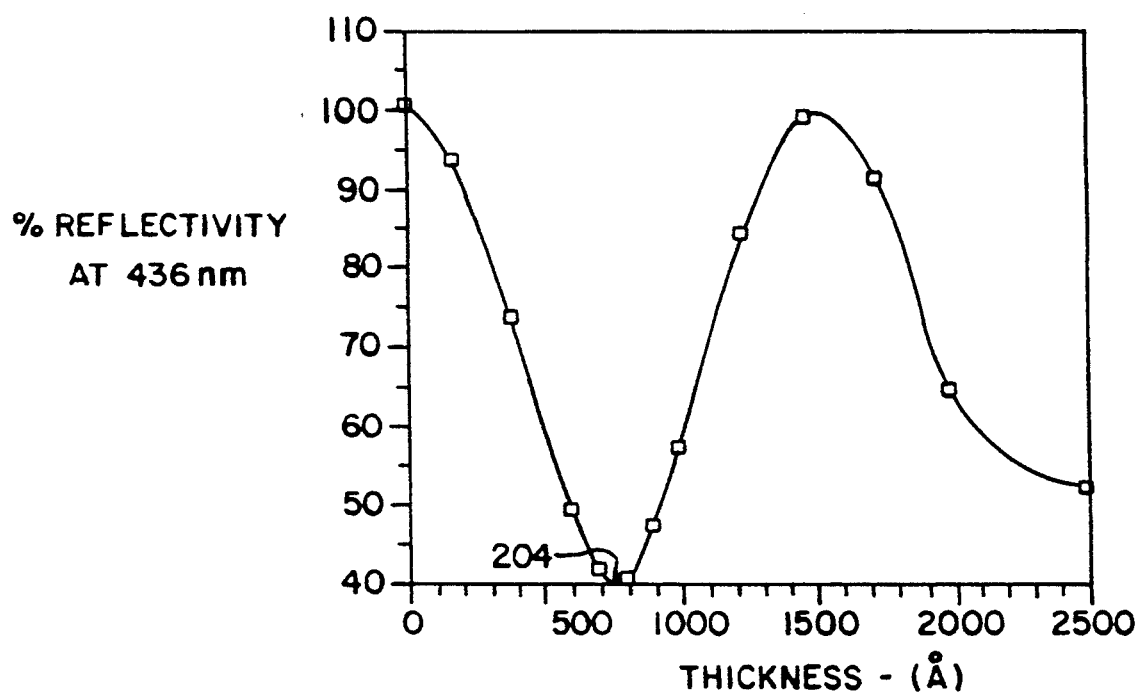
FIG. 2 is a plot of relative percent (%) reflectivity of oxide on silicon at 436 nm, as a function of oxide thickness.

FIG. 2 shows the results of measurements taken on an oxide film over a silicon substrate, as the oxide film is etched away, and illustrates how the relative percent (%) reflectivity (vertical axis) of the oxide film varies as a function of the (remaining) oxide film thickness. Measurements were taken at 436 nanometers (nm) using a Wild Leitz LTS-M/SP measuring tool. In the plot, 100% reflectivity corresponds to an theoretical uncoated silicon wafer (silicon reference). The cyclic nature of the resulting curve is the result of "destructive interference".

Figure 3:
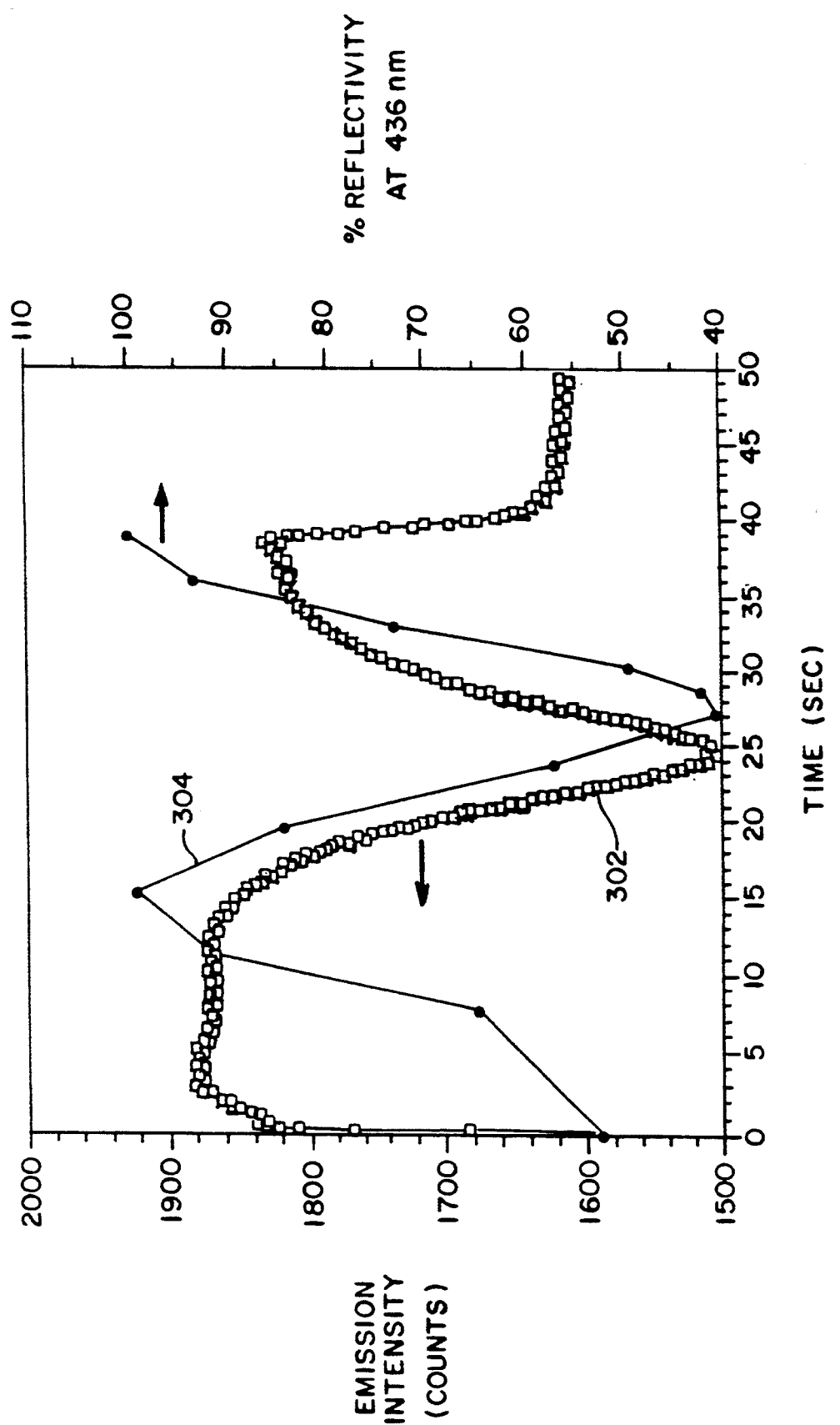
FIG. 3 is a plot of plasma emission intensity (expressed in "counts") versus etch time (in seconds) for actual (squares) versus theoretical reflectivity (dots).

FIG. 3 relates to etching oxide over silicon (see FIG. 2), and shows actual plasma emission intensity (squares) 302 and theoretical % reflectivity (dots) 304 as a function of etch time. Emission intensity is quantified as "counts", on the vertical axis. The data represented in FIG. 3 was obtained while etching a blanket plasma LTO (low temperature oxide coated) wafer on a Rainbow 4500 etcher, with an oxide etch recipe. A 436±5 nm filter was placed behind the back chamber window.

As shown in FIG. 3, the trace (squares 302) dips by almost 400 counts after 24 seconds (sec) of etching. The oxide was 2500 Å thick and very uniform (<±2%), which made this pattern repeatable wafer-to-wafer. The actual endpoint occurs at 40 sec, when the oxide clears the silicon, which produces a 200 count drop.

Since the shape of this pattern resembled the pattern caused by destructive interference shown in FIG. 2, it was thought to be caused by the wafer absorbing a significant amount of light from the plasma.

Returning to FIG. 2, it is apparent that maximum absorption occurs at a point labelled "204" for an 800 Å thick oxide film. The thickness scale (horizontal axis of FIG. 2) is translated into a time scale (horizontal axis of FIG. 3) as the oxide thickness changes during etching.

Figure 4:
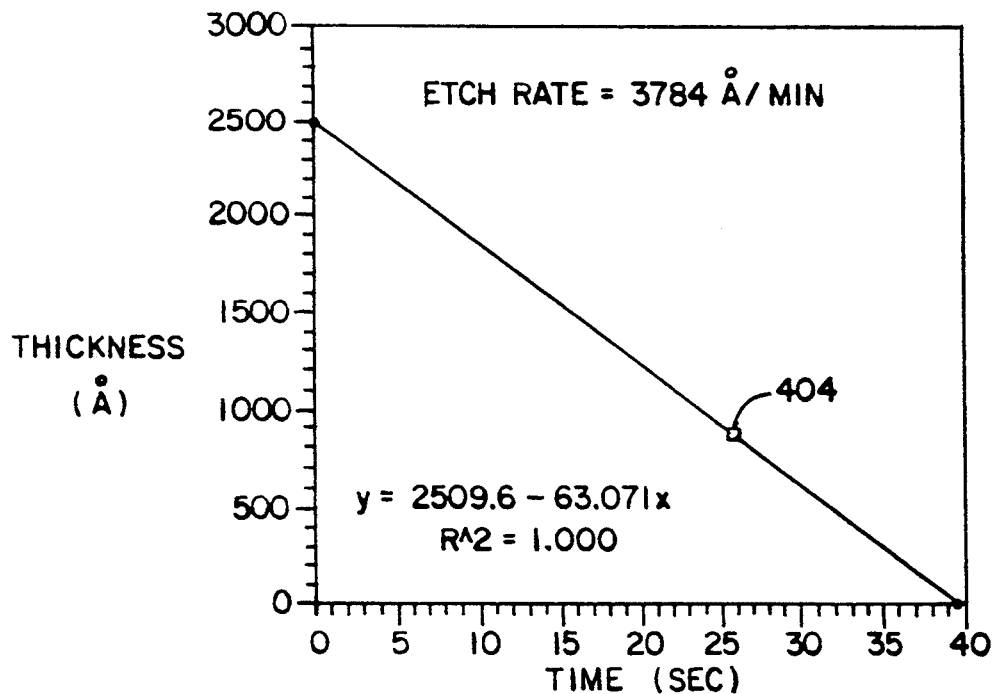
FIG. 4 is a plot of layer thickness (e.g., oxide) versus etch time.

FIG. 4 shows remaining film thickness versus time. AS shown in FIG. 4, the etch rate is linear in time. Using this relationship, and the data from FIG. 2, the theoretical relative % reflectivity was plotted in FIG. 3 (dots 304) so as to overlap the intensity curve (302). Although units are not comparable, the relative position of maximum absorption is well matched (i.e., at 24 seconds for intensity curve 302, and at 27 seconds for the theoretical curve 304; see also point 404 on FIG. 4). The shift may be due to a poor assumption of refractive index, etch rate variations and measurement errors.

The interference effect is more pronounced with very uniform oxide covering a large flat area and with uniform etch rate, as is the case with the blanket oxide on silicon used herein. It was also observed when etching a nonuniform, patterned oxide of comparable average thickness, although the magnitude of the interference effect was reduced (FIG. 5).

Figure 5:
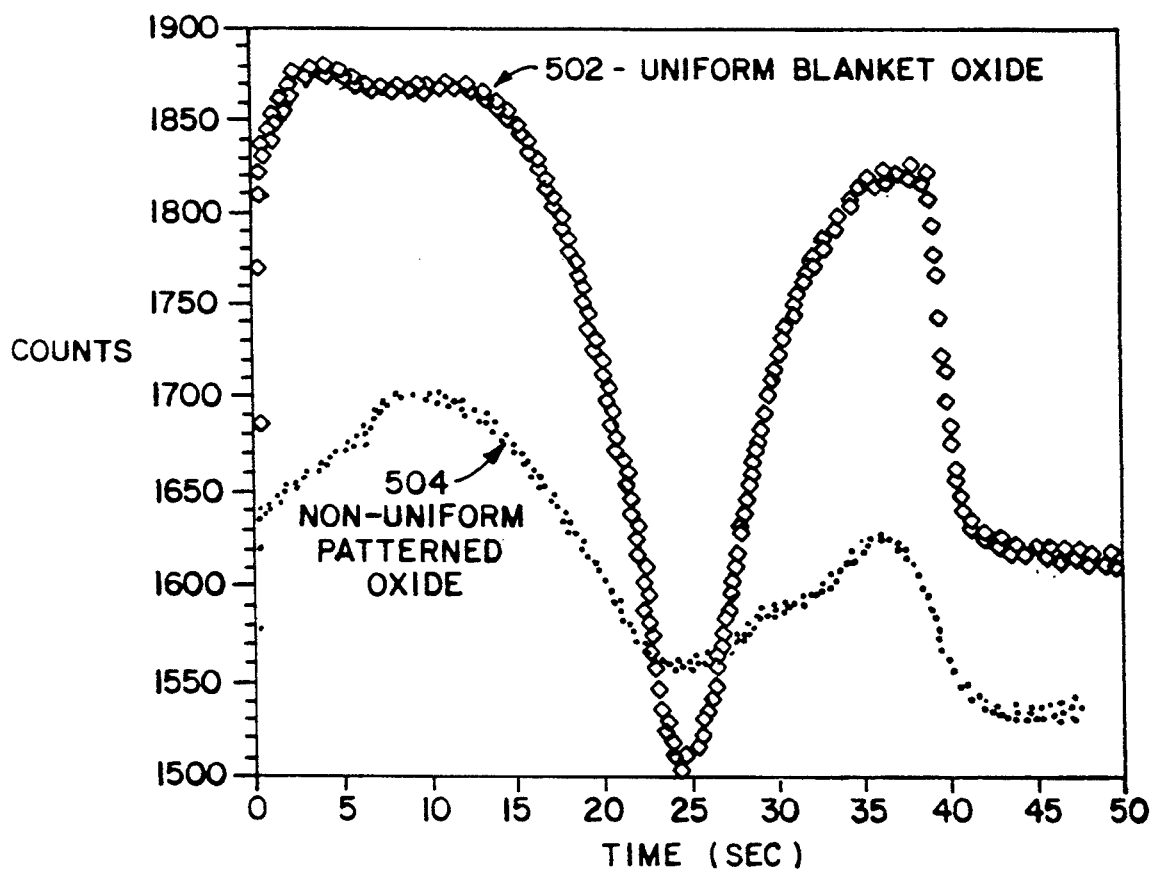
FIG. 5 is a plot of plasma emission intensity versus time, similar to FIG. 3, derived from an experiment monitoring plasma emission at 436 nm from a uniform blanket oxide (diamonds 502) and from a nonuniform patterned oxide (dots 502), etched with a Rainbow etcher.

FIG. 5 shows plasma emission intensities at 436 nm from a uniform blanket oxide (diamonds 502) and from a nonuniform patterned oxide (dots 504), etched on a Rainbow etcher with a typical oxide etch recipe.

These observations were unexpected since the device that collects the plasma emission does not look directly atop the wafer, and is somewhat blinded by the focus ring surrounding the periphery of the plasma. Quartz windows allow light to pass through the ring. This indicates that the oxide film absorbs a substantial amount of light emitted from the plasma at this wavelength.

It can already be seen that the behavior of the endpoint traces can be observed simply by monitoring plasma and wafer emission intensity, for example at 436 nm±5 nm, while etching oxide. The behavior is attributable to interference effects, such as those used in reflectivity spectro-photometry (e.g., operation principle of the Wild Leitz instruments used for measuring film thicknesses). The emission intensity correlates well to theoretical reflectivity values obtained from the Wild Leitz film thickness measuring tool. This effect can be used in some applications to stop etching (endpoint) before uncovering the underlying material, which allows for changing over to a more selective or less damaging etch process (recipe).

As a very general proposition, real-time thickness measurement during plasma etching is not new, but it is typically done with sophisticated optical equipment, and usually involves an additional illuminating source (e.g., a laser). According to the present invention, the emission intensity of the plasma-wafer combination itself is monitored to obtain useful information about the etching process, without the need for additional equipment.

Thus, according to the invention, endpoint traces can reveal interference effects caused by plasma emission being absorbed by the etched film. An absorption minima corresponds to a known remaining thickness, and could therefore be used for endpoint before uncovering the underlying material (before "clearing"). This would enable a switchover to a more selective or less damaging process at a known thickness before clearing. The method could be advantageously employed for resist strip for example, as well as back side etch, or nitride etch. The method works best with very uniform films and etch rates, and large exposed areas (unpatterned wafer).

This "passive" method does not require any special hardware other than standard endpoint devices (filter, monochromator, diode array) found on our plasma etchers. Each application must be dealt with separately and careful choice of wavelength may be necessary. Wavelengths corresponding to intense emission from excited gas products must probably be avoided as they would mask the interference effect.

The effect was observed during oxide etch on silicon. Whether it can be seen in other applications is still to be investigated. For example, it could be used to determine thickness during plasma deposition.

One skilled in the art to which the present invention most nearly pertains will appreciate that while the results obtained hereinabove were obtained and validated during oxide etch over silicon, similar useful results can be obtained to control plasma etching of other materials. Furthermore it will be appreciated that, while the preceding discussion is primarily directed to plasma etching, similar useful results can be obtained to control plasma deposition processes.

Application of Optical Emission Spectroscopy Characterization of Etching Processes Dry etching processes must be regularly characterized in order to assess their current performances against predetermined specifications (operating window). The equipment must be tuned or repaired when current performances fall outside of the operating window.

Troubleshooting of process-related problems and process characterization is best addressed by using statistical methods such as design of experiments (DOE), response surface methodology (RSM) or Taguchi methods, among other known techniques.

Whether a process is working within specifications or not is typically determined by conducting less time consuming but more frequent tests, often referred to as "process qualifications". Qualifications should be quick to reduce production delays yet complete enough to detect (flag) any defects.

Etching qualifications are typically performed on a test (non-working, non-product) wafer, and are typically directed to etch rate, etch uniformity, and sometimes to selectivity or linewidth measurements. Uniformity and selectivity are determined from etch rate measurements at various locations across the wafer using interferometry (reflectivity spectrophotometry) or ellipsometry for film thickness measurements before and after etch. Hence, since the test wafer must be partially etched, product wafers are not suitable for such qualifications because re-etching them to completion would not be desirable from a quality viewpoint.

Figure 6B:
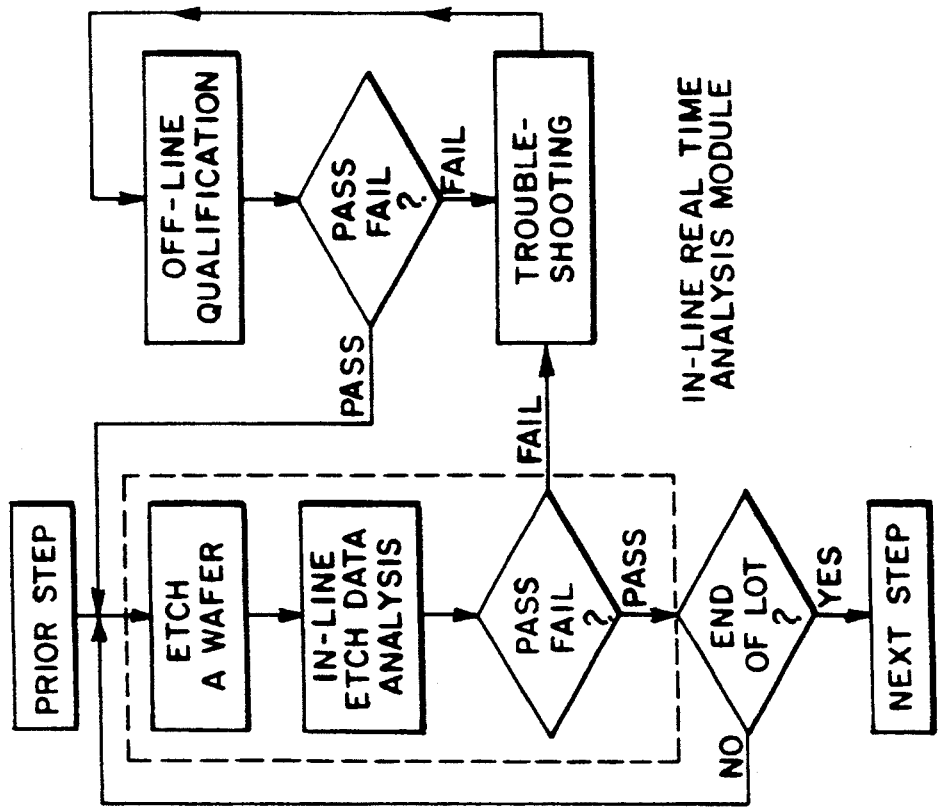
FIG. 6B is a flow chart of steps involved in real time, in-line qualification of etch processes.
Figure 6A:
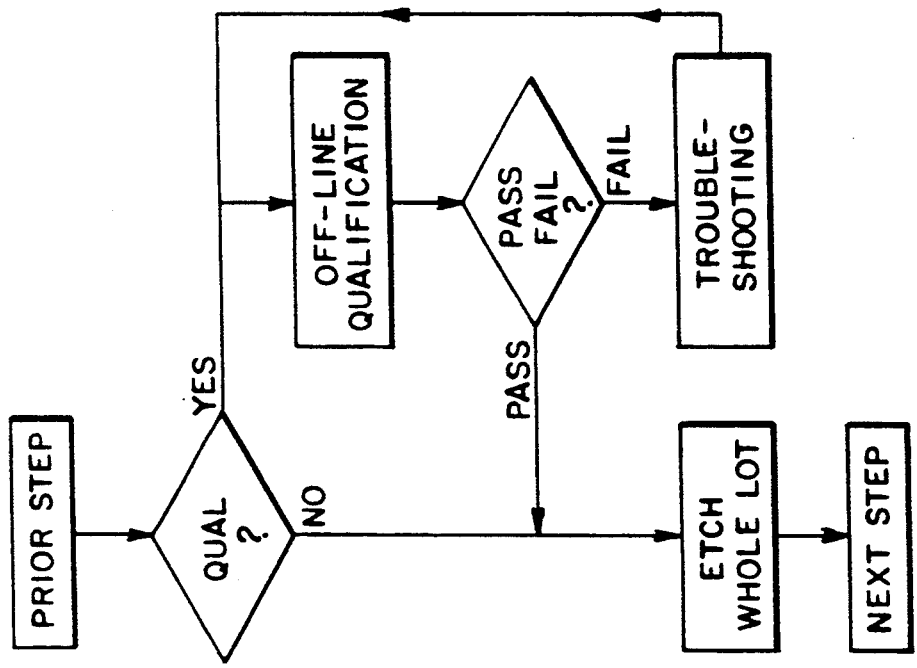
FIG. 6A is a flow chart of steps involved in off-line qualification of etch processes.

FIGS. 6A and 6B illustrate two qualification schemes. FIG. 6A is a flow chart of steps involved in off-line qualification of etch processes. FIG. 6B is a flow chart of steps involved in real time, in-line qualification of etch processes. The latter offers control at the wafer level while saving time and cost of test wafers.

Other than the off-line test wafer method explained above, there is another related technique where etch uniformity is analyzed by means of optical emission, also referred to as endpoint trace. See "Monte-Carlo Simulation of Plasma Etch Emission Endpoint" E. J. Bawolek, Emerging Semiconductor Technology, ASTM STP 960, D. C. Gupta and P. H. Langer, Eds., American Society for testing and Materials, 1986.

Plasma emission has long been used for endpoint purposes. For example, upon completion of etching of a top layer, the underlying material is exposed which changes the emission intensity at certain wavelengths. Monitoring only one such changing signal provides a means of stopping the etching and preserving the underlying material. See U.S. Pat. No. 4,312,732.

According to the present invention, qualification time and cost can be decreased by eliminating the need for off-line measurements, during which production must be halted, or by reducing off-line qualification times while still obtaining the necessary data.

To this end a method has been devised based on analysis of optical emission signals from the plasma during etching. Additional thickness measurements are still required, but these are usually part of the typical overall manufacturing process (e.g., before etch film thickness, after etch underlying film thickness).

Generally, because of film non-uniformity and etch non-uniformity, etching must be carried out beyond endpoint to assure complete clearing (overetch). When a long overetch is required, the etch selectivity to the underlying material must be high to preserve it (e.g. thin gate oxide).

Therefore it is important to achieve good film and etch uniformities in order to reduce overetch, along with high selectivity to preserve the underlying material. The etch rate itself influences throughput.

As noted in the "Monte-Carlo Simulation" reference, mentioned above, a Monte Carlo approach is used to simulate emission intensity as the wafer clears (endpoint). A number of assumptions are made, one of which (No. 4) is significantly different from the present invention in that product species are assumed to be linearly proportional to the exposed (underlying) film area, whereas in the present disclosure that concentration will be shown to not only be proportional to exposed area but also to etch rate. In addition, the reference assumes a random Gaussian distribution of instantaneous etch rate, whereas in general, etch rate may be a reproducible function of wafer location (e.g. center to edge clearing). Finally, the reference aims at reproducing emission intensities during endpoint given certain etch conditions. In the present invention, emphasis is placed on deriving etch conditions from analysis of the emission curve under suitable conditions.

According to the invention, a filter, a monochromator or a diode array is used to collect plasma emission at a given wavelength, or range of wavelengths. The emission intensity I, is converted into an electrical signal (voltage) and digitized (counts), to become the end signal being monitored, S.

The technique of the present invention relies on the following ten assumptions (numbered 1-10):

Assumption #1: the invention best applies to single wafer etchers but could also be useful in batch systems. Most modern dry etching equipment is for single wafer processing.

Assumption #2: the emission intensity I, is assumed to be representative of the overall plasma body rather than of a particular spot. In single wafer systems, the plasma volume is usually small enough for diffusion forces to average out concentrations of monitored species over the time scale used in sampling their emission (e.g. sampling rate in excess of 30 millisec).

Assumption #3: the emission signal S, is assumed to be proportional to the emission intensity I, i.e. $S(t) \alpha I(t)$ where t is the time. The detection device must have sufficient linearity ($< \pm 5\%$) and an adequate usable range to avoid saturation.

Assumption #4: The signal being monitored must preferably represent emission from an etch product (e.g. oxygen in oxide etching) or a consumed species (e.g. fluorine in silicon etching). All are assumed to be proportional throughout the process, $I(t) \alpha [X^*] \alpha [X]$, where [X] is the species concentration in the gas phase and [X*] is the species concentration in its excited state. This assumption will be realized if the electron excitation cross-section of the monitored species is stable. If the electron concentration at the excitation energy of the monitored species is not constant, actinometry can be used to compensate for changes in electron energy distribution. Actinometry is described in *"Optical emission spectroscopy of reactive plasmas: A method for correlating emission intensities to reactive particle density"*, J. W. Coburn, M. Chen, J. Appl. Phys., 51, pp. 3134–3136, June 1980.

Assumption #5: loss of excited species other than by relaxation is assumed to be negligible, i.e. the pumping rate constant is much lower than excitation rates.

Under the above assumptions, the monitored species concentration [X] can be written:

$$[X] = c(A - a)E + baE' + \Sigma_y k_y[Y][X] - k_e[X] - k_p[X] \quad \text{(equation 1)}$$
$$= c(A - a)E/(1 - k) + baE'/(1 - k)$$

where "[X]" is averaged over the entire plasma volume, "c" and "b" are constants, "A" is the total exposed area, "a" is the area that has been cleared, "E" is the film's average etch rate across the wafer, "E'" is the underlying material's average etch rate, and $k = \Sigma_y k_y[Y] - k_e - k_p$ is the balance of produced and lost species X by second order gas phase reactions with species [Y] and rates $k_y$, by electron impact dissociation with rate $k_e$, and by pumping with rate $k_p$. (Note that $k_e$ is only relevant for molecular species.

Assumption #6: k is assumed constant throughout the process. This assumption is valid if clearing of the wafer does not significantly affect the electron impact dissociation cross section in the case of X being molecular, and the concentrations [Y] and rates $k_y$.

When a product of etching is being monitored, its concentration must be a function of etch rates E and E'. If a consumed species was monitored instead, a similar expression could be written but its concentration would be proportional to $-[aE+(A-a)E']$.

In addition, some emission may be present when the wafer is cleared, i.e. a=A, and a background emission may exist in the absence of wafer or when the wafer is patterned by a mask whose etch rate is not zero. Using equation (1), the monitored signal "S" will be written as follows:

$$S = \alpha(A-a)E + \beta aE' + B \quad \text{(equation 2)}$$

where $\alpha = a/(1-k)$ and $\beta = b/(1-k)$ are constants, and "B" is the background signal for A=0 and a=0. The parameter "B" also accounts for gas phase reactions. Before endpoint, a=0 and after complete etch a=A. Defining $S_o = \alpha AE + B$ and $S_\infty = \beta AE' + B$, taking the time derivative of S(t), we obtain:

$$dS/dt = (\beta E' - \alpha E)da/dt = [(S_\infty - S_o)da/dt]/A \quad \text{(equation 3)}$$

accounting for the fact that A, B and etch rates are constant. If a loading effect is present, etch rates become functions of cleared area. Etch rates may also be functions of time when etching conditions drift.

Assumption #7: no significant loading effect, etch rates are assumed constant. The loading effect can be reduced by increasing power and by reducing the gas residence time in the reactor (e.g. high flow rate).

Under assumption #7, equation (3) represents the most general form of endpoint trace as a function of the clearing pattern in time.

Figures 1, 7A:
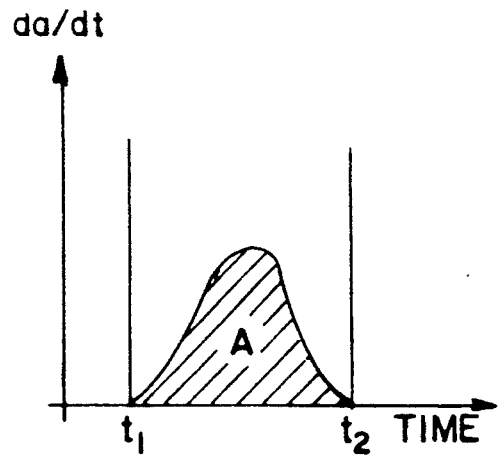
FIG. 7A is two graphs illustrating non-linear clearing pattern of exposed area "A"
Figures 1, 7B:
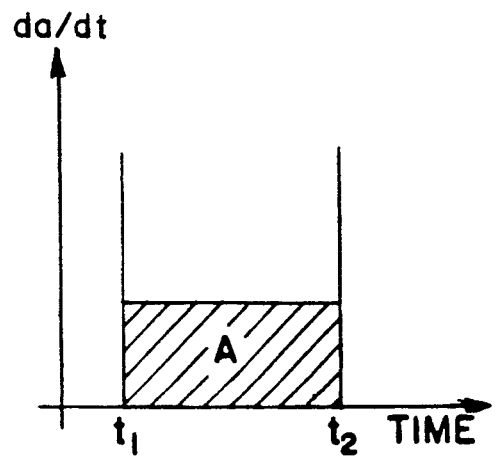
FIG. 7B is two graphs illustrating linear clearing pattern of exposed area "A".
Figures 2, 7A:
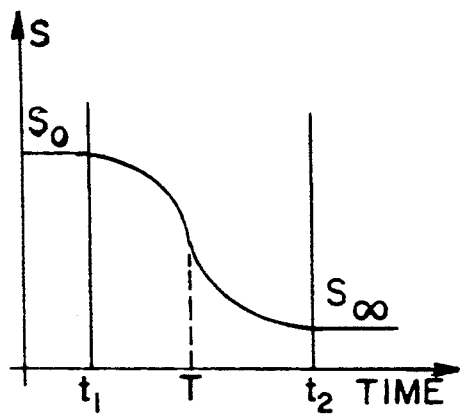
Figures 2, 7B:
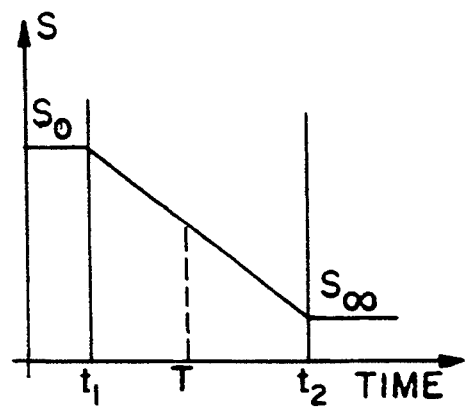
Figure 8A:
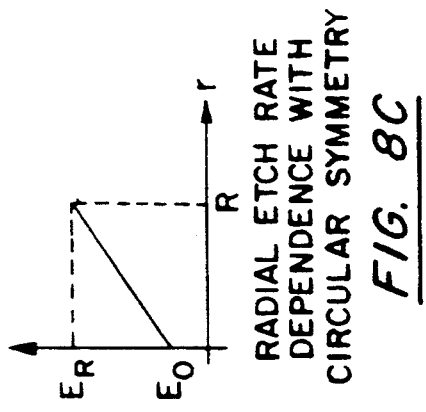
FIG. 8 is graphs of simulated endpoint curves upon clearing of the wafer with radially symmetrical etch rates.
Figure 8C:
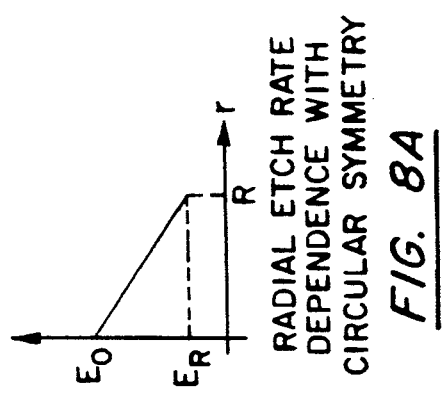
Figure 8B:
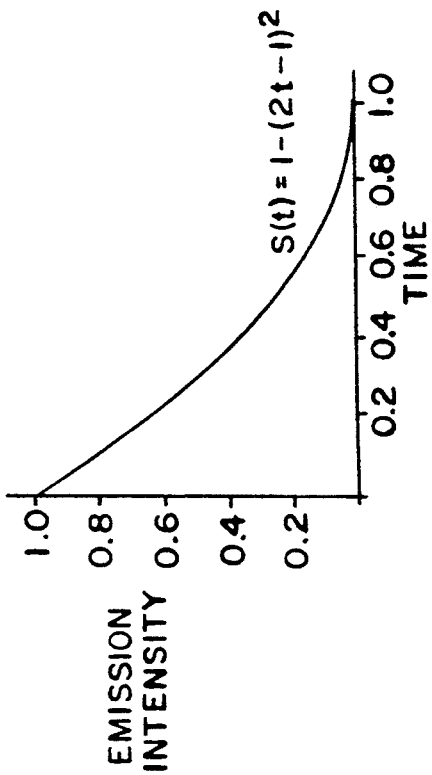
Figure 8D:
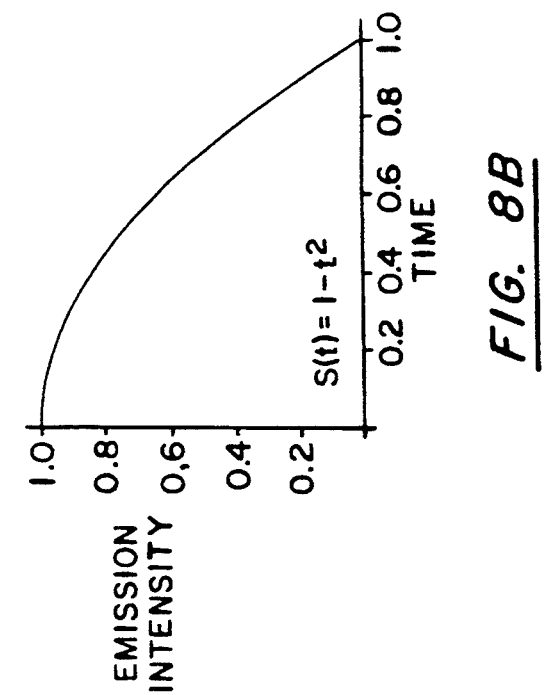

FIG. 7A is two graphs illustrating non-linear clearing pattern of exposed area "A", and FIG. 7B is two graphs illustrating linear clearing pattern of exposed area "A". If $t_1$ and $t_2$ are respectively the times when the wafer starts clearing and completed its etch, then by definition, we must have:

$$\int_{t_1}^{t_2} da/dt = A \quad \text{(equation 4)}$$

Defining "H" as the incoming film thickness to be etched with uniformity $U_n$ and "E" its average etch rate across the wafer with uniformity "u", defined such that $t_1 = H(1-U_n)/(E(1+u))$ and $t_2 = H(1+U_n)/(E(1-u))$ represent the times it takes to clear the thinnest point with the fastest etch rate and the thickest point with the slowest etch rate.

Assumption #8: the analysis is restricted to the case where da/dt=constant can be assumed. That is, the endpoint trace varies linearly from $S_o$ to $S_\infty$ (FIG. 7b). This is usually not true over the entire transition region from $S_o$ to $S_\infty$, but if most of that region can be approximated to a straight line it will be sufficient for all practical purposes.

FIG. 8 is graphs of simulated endpoint curves upon clearing of the wafer with radially symmetrical etch rates. Simulated shapes of endpoint traces with center to edge clearing are shown in FIG. 8 (etch rate is faster or slower at center). The etch rate is assumed to have a radially symmetrical dependence, $E = E_O \pm r(E_O - E_R)/R$, where "r" is the radial position, "R" is the wafer radius, "$E_O$" and "$E_R$" the etch rates at the center (O) and at the edge (R) respectively. A perfectly uniform film was assumed (i.e., u=0). These expressions were introduced in equation (2) and normalized so that $S_o = 1$, and $S_\infty = 0$. The endpoint curve is shown from time $t_1$ to $t_2$, also normalized from 0 to 1.

Hence, it can be seen from FIG. 8 that: $S(t) = S_o + [E(1-u^1)/(2Hu)]^2(S_\infty - S_o)t^2$, for FIG. 8A; and $S(t) = S_o + [E(1-u^2)/(2Hu)]^2(S_\infty - S_o)(4Hut/[E(1-u^2)] - t^2)$, for FIG. 8B.

These behaviors are intuitive if one considers that between times t and $t + \Delta t$ ($t_1 < t < t + \Delta t < t_2$), a ring ($r, r + \Delta r$) of area $2\pi r \Delta r$ is being cleared. If the wafer starts clearing at the center toward the edge, the ring area increases which results in an increasingly fast endpoint drop (shoulder, FIG. 8 left). In case of an edge to center clearing pattern, the opposite argument explains the slowing endpoint drop (tail, FIG. 8 right).

Endpoint curves similar to those of FIG. 8 may also result from loading effects or other clearing patterns, and may not be valid for determining the etch rate uniformity.

Under assumption #8, we can write, $da/dt = A/(t_2 - t_1)$. Introducing this expression in equation (3) with $t_2$ and $t_1$ defined as above, we obtain:

$$dS/dT = [E(1-u^2)(S_\infty - S_O)]/[2H(u+U_n)] \quad \text{(equation 5)}$$

solving for u, and using $\delta = 2H\, dS/dt\, /\, [E(S_\infty - S_o)]$, we obtain:

$$u = [-\delta + \{\delta^2 + 4(1+\delta U_n)\}^{\frac{1}{2}}]/2 \quad \text{(equation 6)}$$

If H and $U_n$ cannot be measured prior to etch, $\delta$ can be determined by equating the time to endpoint T to E/H. Furthermore, $T = (t_1 + t_2)/2$ (FIG. 7), finally:

$\delta = 2T \, dS/dt \, / \, (S_\infty - S_o)$. If the incoming film is very uniform, e.g. $\delta U_n \ll 1$, the term $\delta U_n$ can be dropped out of equation (6), in which case the film uniformity does not need to be measured.

The selectivity of etch rate between the film being etched and the underlying material can be estimated provided that the underlying material's thickness is known prior to etch and can be measured after etch. If the initial thickness is $d_0$ and the minimum final thickness is $d_m$, then the worst case selectivity is given by $R_m = E(1-u)(T_E - t_1)/(d_0 - d_m)$, where $T_E$ is the total etch time including overetch. Defined that way, the minimum selectivity $R_m$ is a conservative figure for the average selectivity $R = E/E' > R_m$, which could also be estimated by $R = E(T_E - T)/(d_0 - d_a)$, where $d_a$ is the average remaining thickness.

In deriving the uniformity "u", it is assumed that the thickest point of the film being etched experiences the slowest etch rate while the thinnest point experiences the fastest etch rate. This may not always be true, and in general: $H(1-U_n)/(E(1+u))) < t_1 < H(1+U_n)/(E(1+u))$ and $H(1-U_n)/(E(1-u))) < t_2 < H(1+U_n)/(E(1-u))$ where the sign (+ or 1) before the term "$U_n$" determines the range over which transitions take place. The sign before the term "u" remains either positive or negative by definition.

Equation (6) provides an upper limit on uniformity u whose target is u=0, for, perfect etch rate uniformity is desired. However this formula will fail to produce meaningful data if the film uniformity is poor i.e. $\delta U_n \geq 1$, in which case the term "u" becomes an estimate of $U_n$, $u \rightarrow U_n$.

Figure 9:
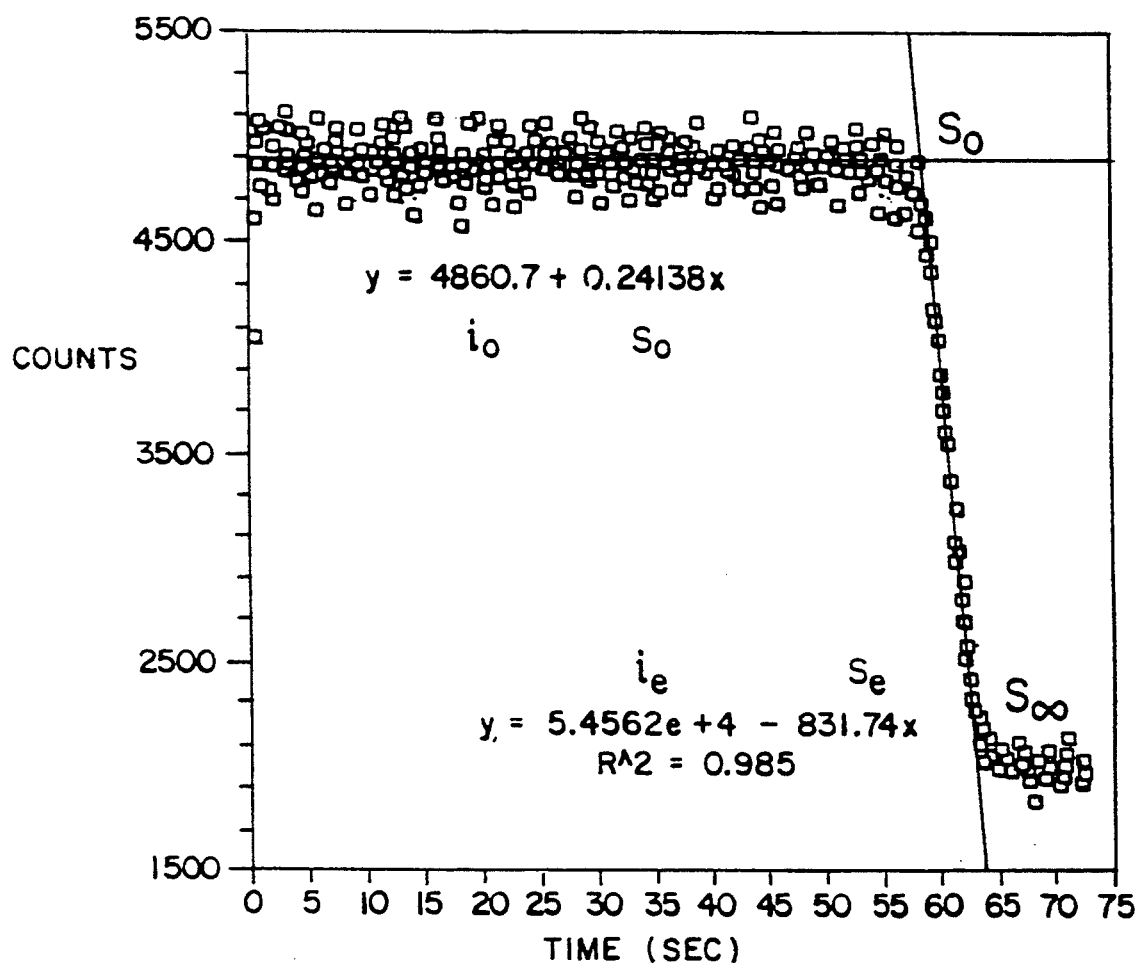
FIG. 9 shows a typical endpoint trace, according to the present invention.

FIG. 9 shows a typical endpoint trace, according to the present invention. Least-squares fits have been used in determining $S_o$ and $dS/dt$. The time $t_1$ is calculated from the intersection of $S(t) = i_e + s_e t$ during endpoint with $S(t) = i_0 + s_0 t$ before endpoint i.e. $t_1 = (i_0 - i_e)/(s_e - s_0)$, and $t_2 = (S_\infty - i_e)/s_e$ where S is estimated from the endpoint trace where it tapers off. Also $S_o = i_0 + s_0 t_1$.

In FIG. 9, emission intensity is expressed in arbitrary units with 0.1 sec time resolution showing signal drop at endpoint (T≈62 sec) and some overetch.

Assumption #9: the monitoring device provides sufficient time resolution so as to derive meaningful fits.

Assumption #10: sufficient overetch is allowed in order to see the tail of the endpoint trace when the film being etched has cleared.

In summary, the overall qualification procedure and analysis of the endpoint trace of FIG. 9 is carried out step by step (Steps 1-15, below):

A) Before etch measurements:

Step 1. Film thickness: $H = 1913 \, \text{Å} \pm U_o = 0.01$ (1.0%)
Underlying film thickness measurements if known: $d_0 = 400 \, \text{Å}$.

B) Observation from endpoint trace:

Step 2. Before endpoint: $S(t) = i_0 + s_0 t$ with $i_0 = 4861$ counts, $s_0 = 0.24$ counts/sec.

Step 3. During endpoint: $S(t) = i_e + s_e t$ with $i_e = 54562$ counts, $s_e = -832$ counts/sec Step 4. After endpoint: $S_\infty = 2000 \pm 100$ counts is estimated.

Step 5. Total etch time including overetch: $T_E = 72.9 \pm 0.05$ sec.

C) Calculations:

Step 6. $t_1 = (i_0 - i_e)/(s_e - s_0) = 59.72$ sec
Step 7. $t_2 = (S_\infty - i_e)/s_e = 63.18$ sec
Step 8. Total etch time to endpoint: $T = (t_1 + t_2)/2 = 61.45$ sec Step 9. $S_o = i_0 + s_0 t_1$, $S_o = 4875$ counts
Step 10. $\delta = 2T s_e /[(S_\infty - S_o)] = 35.561$
Step 11. Check $\delta U_n < 1$: $\delta U_n = 0.36$, OK.
Step 12. Film average etch rate: $E = H/T = 1868$ Å/min.
Step 13. Etch rate uniformity: $u = [-\delta + (\delta^2 + 4(1 + \delta U_n))^{1/2}]/2 = 0.0381$, which reads $u < \pm 3.8\%$.

D) After etch measurements:

Step 14. Underlying film thickness remaining, minimum of 18 measurements across the wafer: $d_m = 230$ Å.

E) Calculation of etch rate selectivity:

Step 15. Ratio of etch rates $R_m = E(1-u)(T_E - t_1)/(d_0 - d_m) = 2.32$, which reads selectivity $R > 2.32:1$.

Under similar etching conditions, an etch rate of 1840 Å/min, a uniformity of ±5.78% and a minimum selectivity of 1.98:1 were measured using partially etched patterned test wafers using a Wild Leitz system. Before and after etch measurements were made at 54 locations distributed across 18 dies (15×15 mm) with three sub-locations per die for estimation of microloading effects.

Under different etching conditions, an etch rate of 7260 Å/min, a uniformity of ±11.7% and a minimum selectivity of 1.85:1 were measured on partially etched test wafers. The endpoint trace analysis resulted in an etch rate of 6326 Å/min, a uniformity of ±7.6% and a selectivity of 1.7:1.

Therefore the endpoint trace analysis produced data consistent with the traditional off-line test wafer method, though absolute values are somewhat different. The microloading effect was not observed, which validates assumption #7.

In the first experiment, etch rates are very similar with both methods but quite different in the second experiment where the test wafer had to be etched for only 10 sec due to the high etch rate. In this case, the optical method is expected to provide a more useful figure.

Differences in uniformity values arise from assumption #8, wherein the onset of endpoint and its tail are not accounted for in estimating the slope (FIG. 9), whereas with 54 measurements per wafer the test wafer method is likely to include these regions.

Selectivity trends are also similar. Note that although minimum selectivity figures are different between these two etching conditions, their averages were similar at 2.1:1.

Error margins can also be determined for etch rate, uniformity and selectivity values based on the noise of the emission signal and on known measurement errors.

In summary, the feasibility of in-line optical emission intensity analysis during plasma etching is a viable technique for characterizing etch rate, uniformity and subsequently selectivity. The method applies when ten basic assumptions are fulfilled, the most restrictive being in order of importance: i) absence of a significant loading effect, ii) a linear change of emission signal over most of the endpoint transition, and iii) sufficient overetch for clearing the film being etched. Other requirements can be met by careful choice of hardware and monitored wavelength(s).

The method applies to, but is not restricted to, nitride island etch, polysilicon etch, oxide spacer etch, contact etch. It is useful in conducting Design Of Experiments (DOE) where several processes must be compared while collecting line width data. In that case wafers are etched to completion while etch characteristics can still be obtained, whereas the traditional method would require extra test wafers for partial etch.

Coupled to an in-line analysis module, the method is useful for characterizing product wafers being etched, even on an individual basis if desired. In this manner, off-line equipment qualifications would not be necessary to the extent that the equipment is working within specifications.

The technique of this invention presents a novel method for determining the uniformity of etch rate during plasma processing of production or test wafers in single wafer etchers. Under suitable conditions often met in today's advanced process equipment, the etch rate and its uniformity and in some cases the selectivity of etch to the underlying material can be derived by analysis of optical emission signals from the plasma itself. This method allows in-line qualification of etching equipment without the need for test wafers or off-line thickness measurements. Since etching is carried out to completion, data relevant to the final result, such as linewidths, can easily be retrieved. In addition, manufacturing of the wafer under test can be resumed without compromising its quality.

Laser illumination requires a laser and an illumination port in the etching equipment. Another limitation is that, generally, a laser will illuminate only a small spot on the wafer being monitored, which means that a single feature will characterize the results for the entire wafer. With the present technique of monitoring plasma intensity itself, no additional equipment/ports are required, and the entire wafer is monitored. Furthermore, with the techniques of the present invention, the etching of product (i.e, working) wafers can be easily monitored.

What is claimed is:

1. Method of monitoring removal of a film on a product wafer during plasma etching, comprising:
    removing a film on a wafer, overlying an underlying material, by a plasma etching process with a plasma having an emission intensity, said film having an initial thickness prior to etching and a remaining thickness during etching;
    while etching the film, monitoring the plasma emission intensity at a selected wavelength, said monitoring occurring non-perpendicularly to the wafer; and
    correlating variations in the plasma emission intensity, attributable to reflected light interference phenomena, by observing a cyclic pattern in emission intensity, to the remaining film thickness.

2. Method according to claim 1, further comprising:
    determining the selectivity (film:underlying material) of the etching process.

3. Method according to claim 1, further comprising:
    determining etch rate and uniformity based on changes in the plasma emission intensity during etching.

4. Method according to claim 1, wherein:
    the film is nitride.

5. Method according to claim 1, wherein:
    the film is polysilicon.

6. Method according to claim 1, wherein:
    the film is oxide.

7. Method according to claim 1, wherein:
    the underlying material includes a contact.

8. Method according to claim 1, further comprising:
    etching the wafer with a high-rate, low-selectivity (film:underlying material) etch recipe until a known film thickness remains; and
    thereafter continuing to etch with a low-rate, high-selectivity (film:underlying material) etch recipe until the film is at least cleared.

9. Method according to claim 8, further comprising:
    continuing to etch after the film has been cleared from the underlying material using the low-rate, high-selectivity etch recipe, to ensure that the film is cleared.

10. Method, according to claim 1, further comprising:
    determining, prior to etching, an initial thickness "$d_0$" for the underlying material;
    determining, after completion of etching, a minimum final thickness "$d_m$" for the underlying material;
    etching for a total etch time of "$T_E$", including any overetch;
    determining a time "$t_1$" whereupon the film begins clearing from the wafer;
    determining an etch rate "E", averaged across the wafer, for the film being etched;
    determining a uniformity "u" of the etch rate "E"; and
    estimating a selectivity "$R_m$" of etch rates between the film and the underlying material, according to the relationship:

$$R_m = E(1-u)(T_E - t_1)/(d_0 - d_m).$$

11. Method, according to claim 1, further comprising:
    determining, prior to etching, an initial thickness "$d_0$" for the underlying material;
    determining, after completion of etching, an average remaining thickness "$d_a$" for the underlying material;
    determining an endpoint of etching, exclusive of any overetch;
    determining a time "T" as the etching time required to reach the endpoint of etching;
    etching for a total time of "$T_E$", including any overetch;
    determining an etch rate "E", averaged across the wafer, for the film being etched; and
    estimating a selectivity "$R_m$" of etch rate between the film and the underlying material, according to the relationship: $R = E(T_E - T)/(d_0 - d_a)$.

12. Method, according to claim 1, further comprising:
    determining an endpoint of etching, exclusive of any overetch;
    determining a time "T" as the etching time required to reach the endpoint of etching; and
    determining a uniformity "u" of the film subsequent to etching, according to the relationship:

$$u = [-\delta + \{\delta^2 + 4(1 + \delta U_n)\}^{\frac{1}{2}}]/2;$$

wherein:
    "$\delta$" $= 2T \, dS/dT \, / \, (S_\infty - S_o)$;
    "S" is the plasma emission intensity measured during etching;
    "$S_\infty$" is the plasma emission intensity measured after complete clearing of the film;
    "$S_o$" is the plasma emission intensity measured prior to the endpoint of etching; and
    "$U_n$" is the initial, pre-etch uniformity of the film.

* * * * *